(12) United States Patent
Wissell et al.

(10) Patent No.: US 7,199,671 B2
(45) Date of Patent: Apr. 3, 2007

(54) SYSTEMS AND METHODS FOR CLOCK GENERATION USING HOT-SWAPPABLE OSCILLATORS

(75) Inventors: Daniel Wissell, Acton, MA (US); Daniel A. Strickland, Northboro, MA (US); Michael J. Tsuk, Arlington, MA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 225 days.

(21) Appl. No.: 11/095,115

(22) Filed: Mar. 31, 2005

(65) Prior Publication Data

US 2006/0226920 A1    Oct. 12, 2006

(51) Int. Cl.
*H03L 7/00* (2006.01)

(52) U.S. Cl. .............................. 331/2; 331/48
(58) Field of Classification Search .............. 331/2, 331/46
See application file for complete search history.

(56) References Cited

U.S. PATENT DOCUMENTS

| | | | | | |
|---|---|---|---|---|---|
| 3,667,048 | A | * | 5/1972 | Hansen | 375/357 |
| 4,282,493 | A | * | 8/1981 | Moreau | 331/2 |
| 4,598,257 | A | * | 7/1986 | Southard | 331/2 |
| 4,779,008 | A | * | 10/1988 | Kessels | 327/147 |
| 5,726,607 | A | * | 3/1998 | Brede et al. | 331/2 |
| 6,970,045 | B1 | * | 11/2005 | Lichter et al. | 331/2 |
| 7,043,655 | B2 | * | 5/2006 | Wu | 713/501 |

* cited by examiner

*Primary Examiner*—Joseph Chang

(57) ABSTRACT

In one embodiment, a clock generation system comprises first and second hot-swappable oscillator (HSO) devices that generate respective timing signals, a plurality of controllable attenuators for controllably attenuating one of the timing signals, a combiner for combining the timing signals, a redundant clock source (RCS) device for generating at least one clock for distribution to other circuits using an output of the combiner, and logic for switching which of the timing signals is attenuated in response to failure of one of the first and second HSO devices.

21 Claims, 5 Drawing Sheets

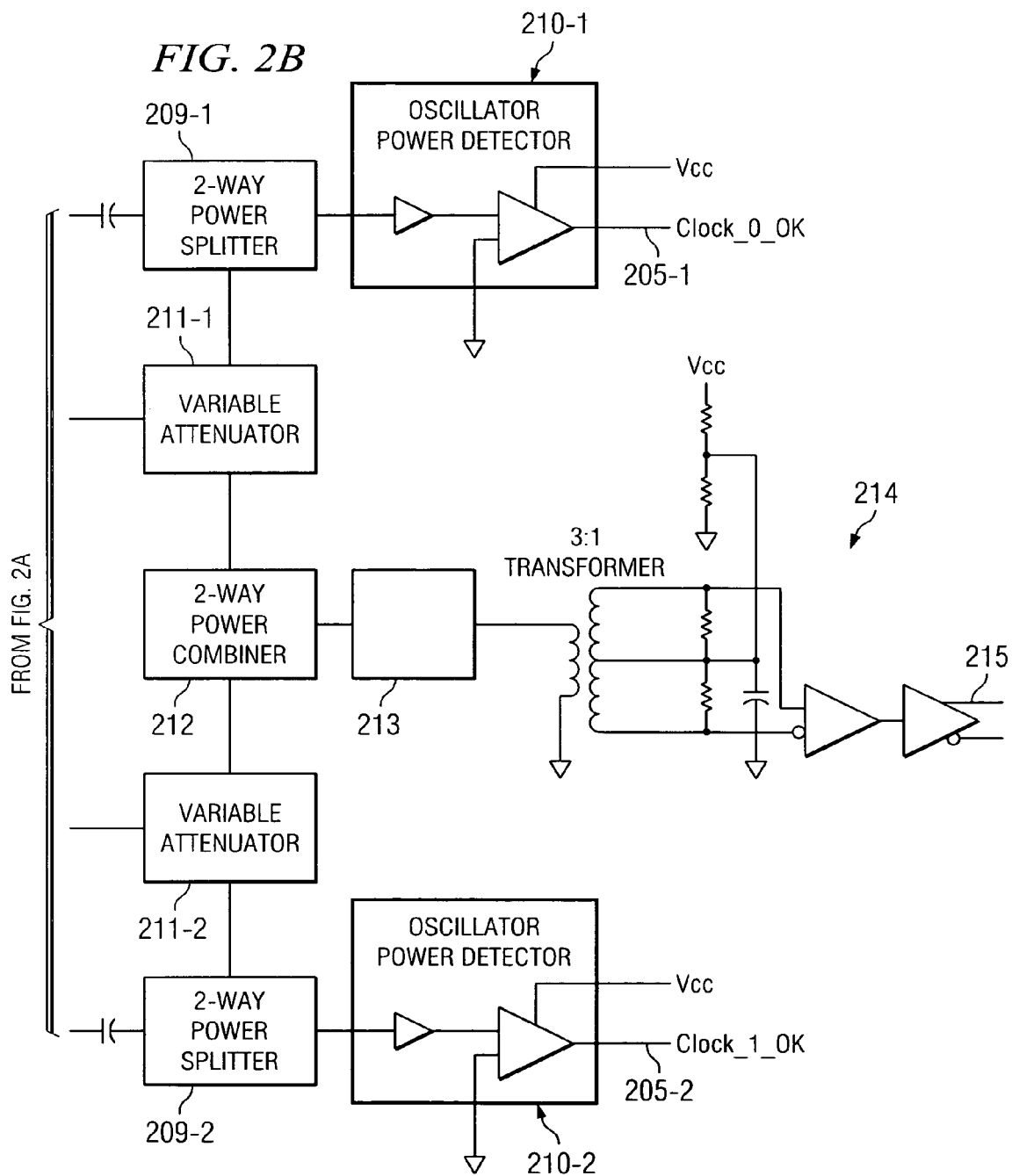

SYSTEMS AND METHODS FOR CLOCK GENERATION USING HOT-SWAPPABLE OSCILLATORS

DESCRIPTION OF RELATED ART

Electronic equipment systems employ clock sources to control the timing of logic components within the systems. In traditional systems, a clock generation module or card is employed on the backplane of the system to distribute timing signals through the backplane to each chassis card. The clock generation module may include an oscillator crystal driving a phase-locked loop. The clock generation module may also possess various filtering circuits and clock duplication functionality. From the clock generation module, the clocks are distributed to the other cards of the system to control the timing of logical events.

The traditional approach created a single point of failure for the supported system. Specifically, if the clock module malfunctioned for any reason, the entire system would cease to function. Accordingly, redundant clock generation designs have been implemented. In one example, a clock generation module includes two oscillator crystals. During ordinary operation, one of the oscillator crystals is used as a master device to generate the clock for distribution and the other oscillator operates in synchronization. If the master oscillator fails for any reason, circuitry within the clock module detects the failure and switches the clock generation to the timing signal generated by the secondary oscillator.

SUMMARY

In one embodiment, a clock generation system comprises first and second hot-swappable oscillator (HSO) devices that generate respective timing signals, a plurality of controllable attenuators for controllably attenuating one of the timing signals, a combiner for combining the timing signals, a redundant clock source (RCS) device for generating at least one clock for distribution to other circuits using an output of the combiner, and logic for switching which of the timing signals is attenuated in response to failure of one of the first and second HSO devices.

In another embodiment, a method of performing clock generation for electronic equipment comprises generating respective timing signals by hot-swappable oscillator (HSO) devices, attenuating one of the timing signals, combining the timing signals after the attenuating, generating, by a redundant clock source (RCS), a clock for distribution to the electronic equipment using the combined timing signals, detecting, by the RCS, failure of one of the HSO devices, and switching, by the RCS, which of the timing signals is attenuated in response to the detecting.

In another embodiment, a system comprises first and second means for generating timing signals in a hot-swappable manner, means for controllably attenuating one of the timing signals, means for combining the timing signals after operation of the means for controllably attenuating, means for generating at least one clock for distribution to circuits of the system using an output of the means for combining, and means for switching which of the timing signals is attenuated in response to failure of one of the first and second means for generating.

DETAILED DESCRIPTION

Figure 1:
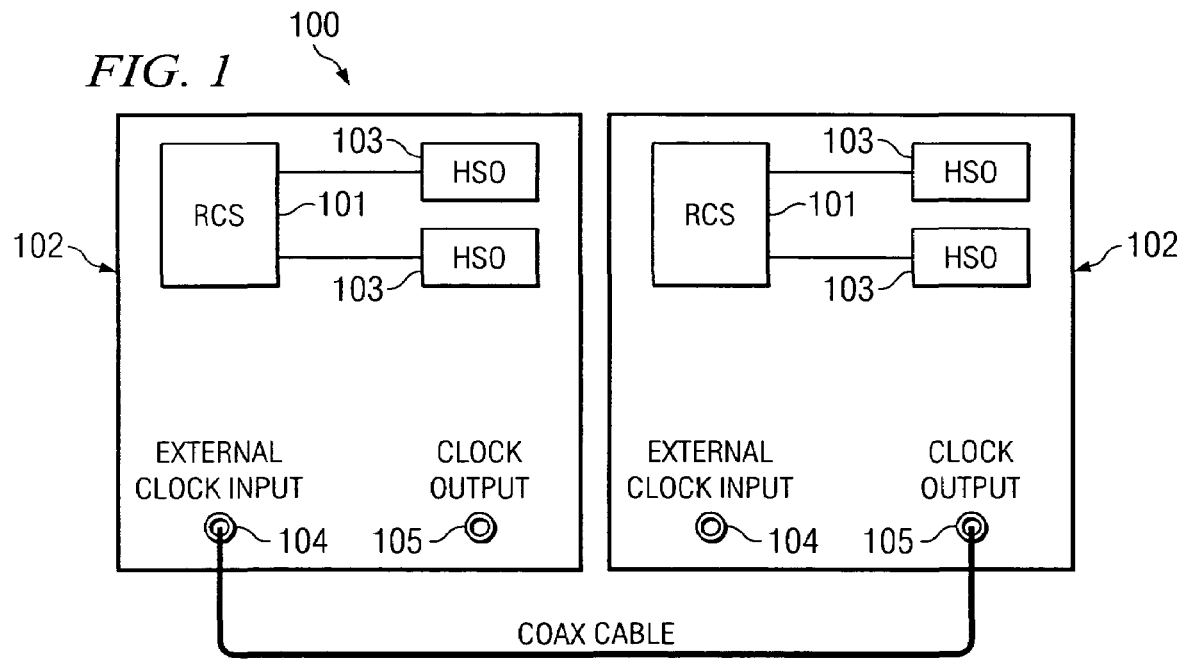
FIG. 1 depicts a plurality of clock generation systems according to one representative embodiment

Representative embodiments are directed to providing hot-swappable oscillators to implement a redundant clock distribution system. In some representative embodiments, a redundant clock source element receives timing signals from a plurality of hot-swappable oscillator devices. The redundant clock source element attenuates one of the timing signals and combines the timing signals. The redundant clock source element uses the combined timing signals to distribute one or several clocks to a backplane of a computer system or other suitable electronic equipment. Specifically, the redundant clock source element uses the combined timing signal to drive a phase-locked loop (PLL). Due to the "capture effect," the PLL synchronizes to the non-attenuated timing signal. The principle of the capture effect is that when two signals are linearly added, the phase of the added signal is dominated by the phase of the stronger of the two signals (assuming that the amplitudes differ by several dB). If one of the oscillator devices ceases to function or begins to function improperly, the operation of the PLL is not interrupted and the supported electronic circuitry does not cease functioning. For example, upon failure of the oscillator device that provides the non-attenuated signal, the attenuated signal is provided to the PLL. The PLL continues generating the clock for distribution and shifts its phase over an amount of time to the attenuated signal. Accordingly, the failure of a single oscillator device does not create a single point of failure in the system.

Additionally, in some representative embodiments, the redundant clock source further comprises switching logic that responds to the failure of one of the oscillator devices. As previously noted, the capture effect is used to control which timing signal drives the PLL by applying attenuation to one of the timing signals. Upon the failure of the oscillator device providing the non-attenuated timing signal, the switching logic causes the attenuation to be reversed. Specifically, the attenuation provided to the previously attenuated signal is removed and attenuation is provided in the signal path associated with the failed timing signal. Accordingly, when the failed oscillator device is removed and replaced, the replacement oscillator device provides an attenuated timing signal. By causing the replacement oscillator device to provide the attenuated signal, the probability of the replacement procedure causing an interruption in system operations is appreciably reduced.

In some embodiments, hot-swappable oscillator devices are implemented using an oscillator card, device cover, and device housing. The oscillator card holds an oscillator unit that has an oscillator crystal used to generate a timing signal and an interconnect. The oscillator card is coupled to a device cover using suitable fasteners. The device housing also couples to the backplane of a computer system using suitable fasteners. The device cover is adapted to mechanically couple to the device housing using latching structures. Furthermore, the device housing comprises an interconnect corresponding to the interconnect to the oscillator unit.

When the oscillator card is inserted into the device housing by placement of the device cover, the corresponding interconnects enable power to be received by the oscillator unit and the timing signal to be communicated to the backplane.

Furthermore, the corresponding interconnects of the device housing and the oscillator unit possess multiple levels. The multiple levels enable the removal of the oscillator card to be detected before the portions of the interconnects that communicate the timing signal lose contact. Specifically, a lower level of the interconnects enables a detection path to be established. If the detection path enables communication of a signal from the hot-swappable oscillator device to the redundant clock source element, it is assumed that the hot-swappable oscillator device is present. However, if the detection path is interrupted and the communication of the signal ceases, it is assumed that the hot-swappable oscillator device is being removed and the redundant clock source may vary the attenuation provided to the timing signals (if necessary).

Referring now to the drawings, FIG. 1 depicts clock generation system 100 according to one representative embodiment. System 100 includes redundant clock sources 101 attached to respective backplanes 102. Each backplane 102 is a circuit board that contains sockets or expansion slots where other computer boards can be connected. Redundant clock source 101 receives multiple timing signals. From one of the timing signals, redundant clock source 101 generates a clock for distribution through backplane 102 for provision to suitable circuits and devices. Redundant clock source 101 may perform electrical filtering of the clock as appropriate. Furthermore, redundant clock source 101 may perform clock duplication depending upon the number of clocks supported by a given system or platform. When providing multiple clocks, redundant clock source 101 may perform multiplication and division of the clock frequency as appropriate for particular system specifications. Also, input port 104 may be used to receive a clock signal from another backplane 102 to enable synchronization of clocks. Likewise, output port 105 may be used to communicate a clock to another backplane 102 for this purpose.

A plurality of hot-swappable oscillator devices 103 communicate respective timing signals generated by their crystal oscillators through backplane 102 to redundant clock source 101. Furthermore, respective signals are communicated from hot-swappable oscillator devices 103 to redundant clock source 101 indicating whether hot-swappable oscillator devices 101 are fully connected to backplane 102.

Figure 2A:
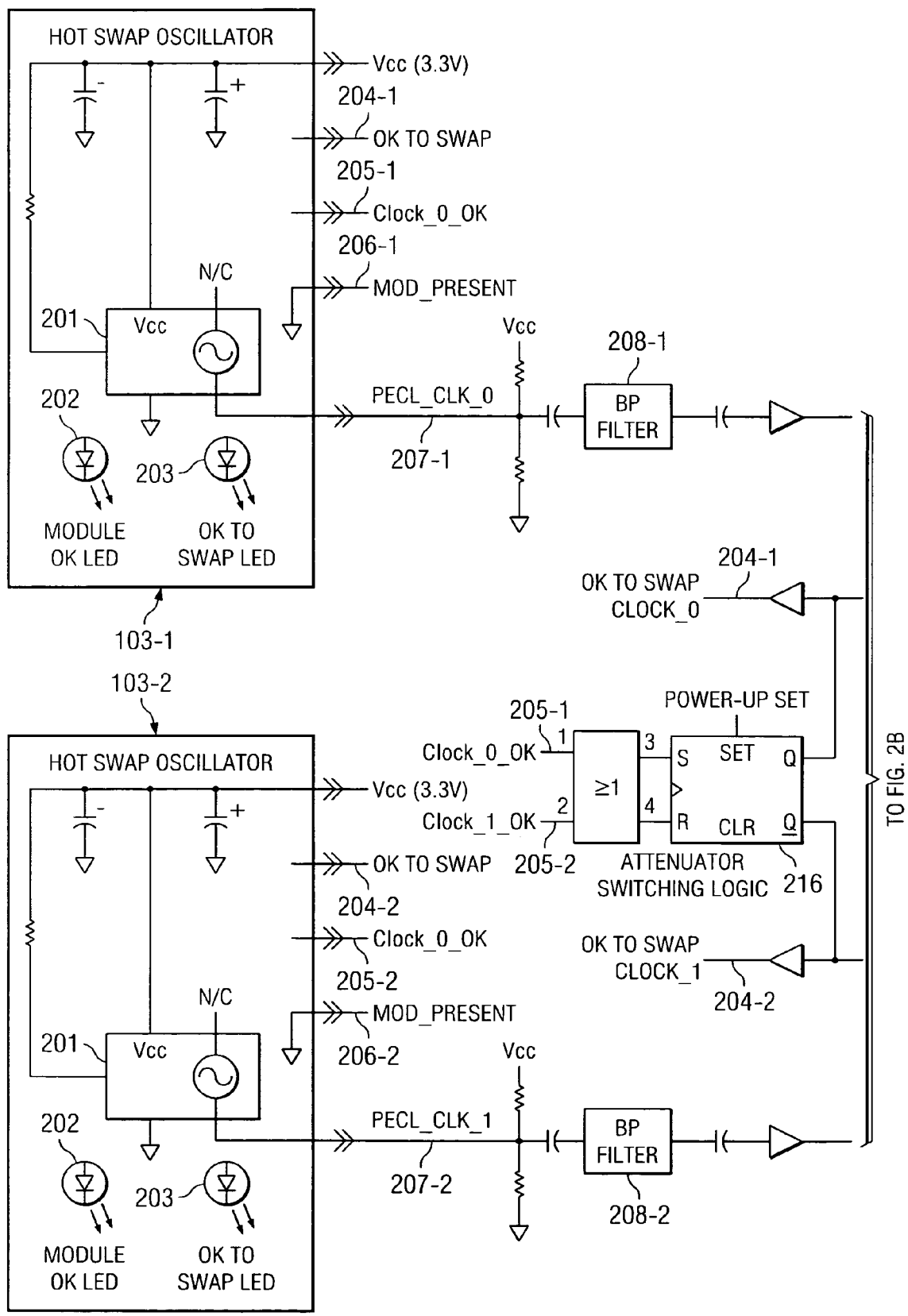
FIG. 2 depicts a circuit diagram according to one representative embodiment.

FIG. 2 depicts circuit diagram 200 according to one representative embodiment. In circuit diagram 200, two hot-swappable oscillator devices (denoted 103-1 and 103-2) are shown. Within each hot-swappable oscillator device 103, an oscillator crystal 201 is used to generate a respective timing signal 207 (also denoted by PECL_CLK_0 and PECL_CLK_1). The timing signals 207-1 and 207-2 are filtered by bandpass filters 208-1 and 208-2 respectively. Bandpass filters 208-1 and 208-2 may be implemented using narrowband surface acoustic wave (SAW) filters having center frequencies selected to match the desired operating frequencies of crystal oscillators 201.

The use of bandpass filters 208-1 and 208-2 enables "no output," "stuck-at" (substantially constant output), and improper operating frequency fault modes to be detected. Specifically, when any of these faults occur, the output of the respective bandpass filter 208 is approximately zero. Power splitters 209-1 and 209-2 provide a portion of the outputs of bandpass filters 208 to oscillator power detectors 210-1 and 210-2. Oscillator power detectors 210 output signals 205-1 and 205-2 (denoted by Clock_0_OK and Clock_1_OK) that are indicative of whether timing signal faults have occurred.

Power splitters 209-1 and 209-2 also provide a portion of power of the bandpass filtered signals to variable attenuators 211-1 and 211-2. One of variable attenuators 211-1 and 211-2 attenuates a respective filtered timing signal (e.g., by several dB). The non-attenuated and attenuated timing signals are combined using power combiner 212. The other port of power splitter 212 is coupled to another bandpass filter 213. Transformer 214 is coupled to filter 213. Output signal 215 is generated from transformer 214. Output signal 215 is then used to drive an PLL for clock generation operations.

The outputs of detectors 205 are used to control attenuator switching logic 216. Specifically, when a fault mode occurs, attenuator switching logic 216 changes its logic state in response to signals 205-1 and 205-2. The complementary outputs of attenuator switching logic 216 change according to the change of the logic state. The complementary outputs of attenuator switching logic 216 are coupled to variable attenuators 211-1 and 211-2. According to the outputs of logic 216, one of attenuators 211 applies an amount of attenuation and the other attenuator 211 preferably does not apply any attenuation.

The outputs of logic 216 are also used to generate signals 204-1 and 264-2 (also denoted by OK_TO_SWAP_CLOCK_0 and OK_TO_SWAP_CLOCK_1) to user whether a respective hot swappable device may be removed. Hot swappable oscillator devices 103 further include inputs for signals 204 and 205. These signals are used to control light emitting diodes (LEDs) 202-1, 202-2, 203-1, and 203-2. Hot swappable devices 103-1 and 103-2 further include outputs 206-1 and 206-2 (also noted by MOD_PRESENT) that indicate whether a modular unit containing oscillator crystal 201 is inserted within the device 103. Multiple level interconnects may be used to generate signals 206 as will be discussed below.

Figure 3:
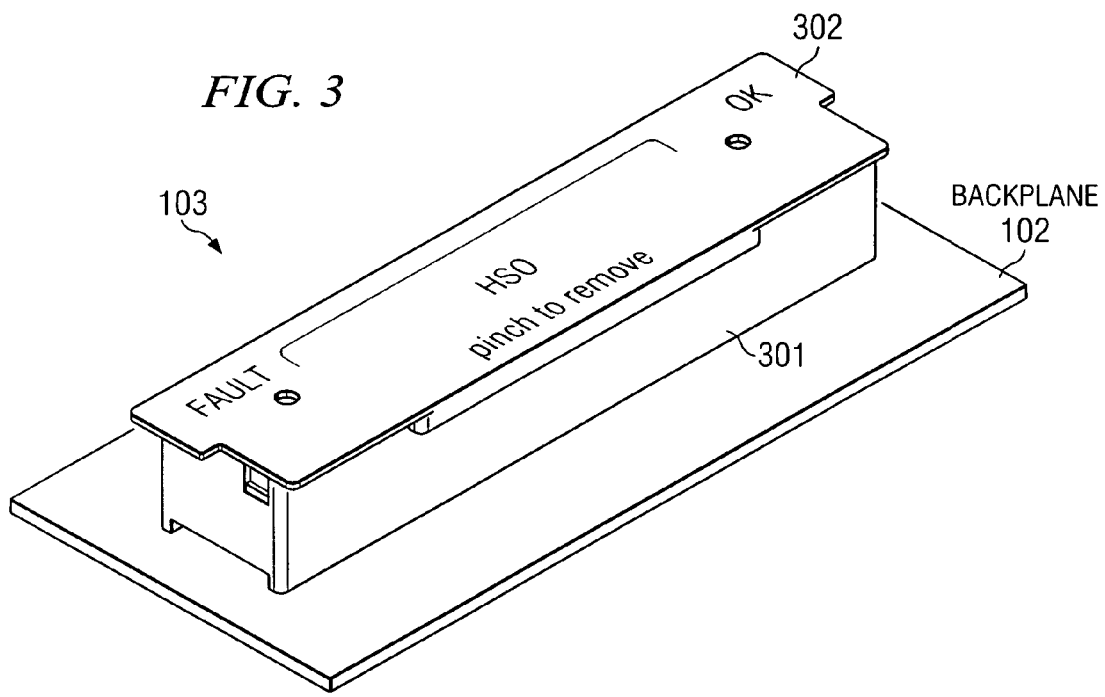
FIG. 3 depicts a fully assembled hot-swappable device coupled to a backplane according to one representative embodiment.

FIG. 3 depicts a fully assembled hot-swappable device 103 coupled to backplane 102 according to one representative embodiment. As seen in FIG. 3, hot-swappable device 103 includes base housing 301 that is mechanically coupled to backplane 102. Cover element 302 is inserted within base housing 301. Base housing 301 and cover element 302 enclose the oscillator crystal and related circuitry. Cover element 302 includes a plurality of light emitting diodes (LEDs) to indicate the functional state of hot-swappable oscillator 103.

Figure 4:
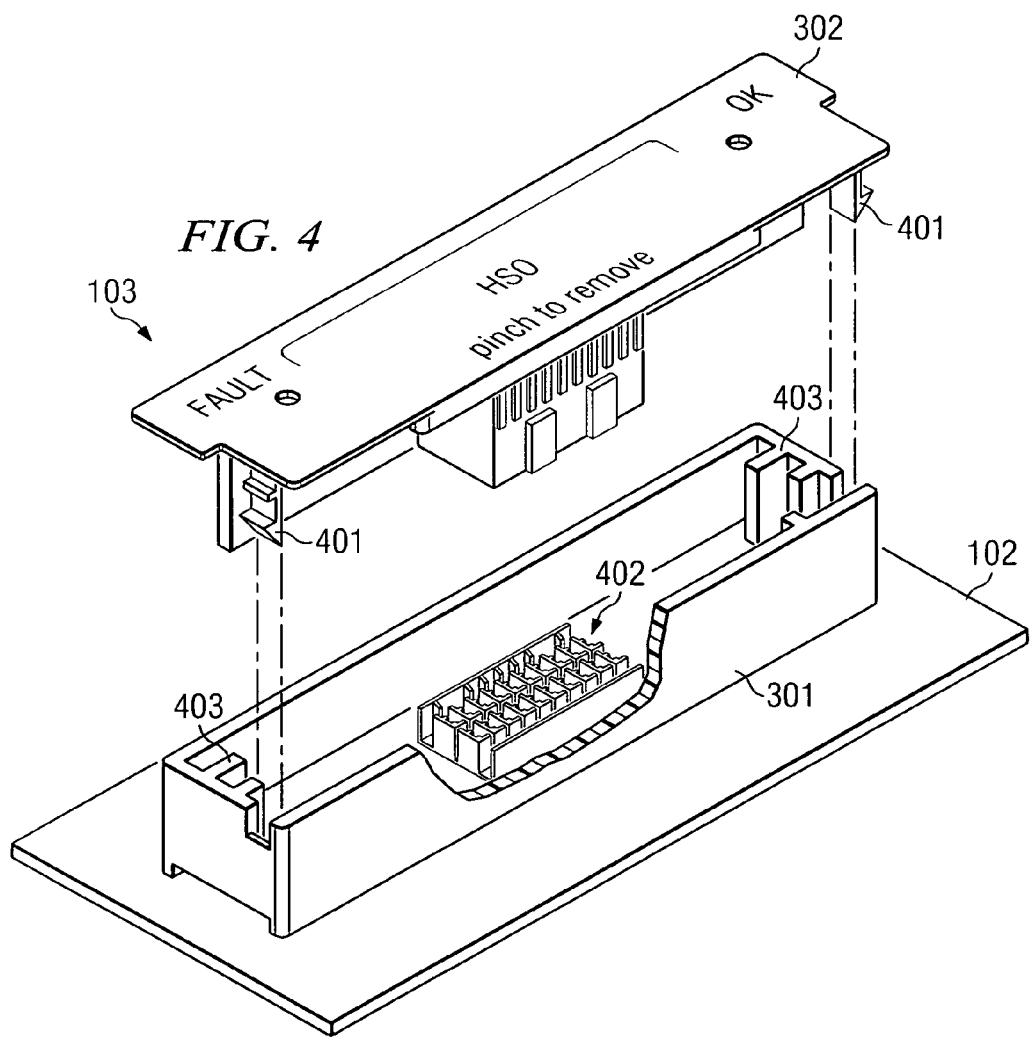
FIG. 4 depicts a disassembled hot-swappable device according to one representative embodiment.

If the oscillator of hot-swappable oscillator 103 ceases to function properly, cover element 302 can be removed from base housing 301 by manual depression of the side walls of cover element 302. Specifically, application of pressure displaces latches 401 thereby releasing cover element 302 as shown in FIG. 4. As seen by the removal of cover element 302, base housing 301 includes guides 403 for receiving a circuit board to which an oscillator unit is attached. Guides 402 align the oscillator unit to be coupled within header 402.

Header 402 provides a multi-level interconnect that is used for the generation of MOD_PRESENT signal 206 (see FIG. 2). One of the levels of the interconnect enables the presence of the oscillator unit (not shown) to be detected. A second level of the interconnect enables the timing signal generated by the oscillator unit to be communicated to redundant clock source 101 through backplane 102. The first level of the interconnect is shorter than the second level. When the oscillator unit is being removed from header 402, the first level of the interconnect is disconnected first.

Figure 5:
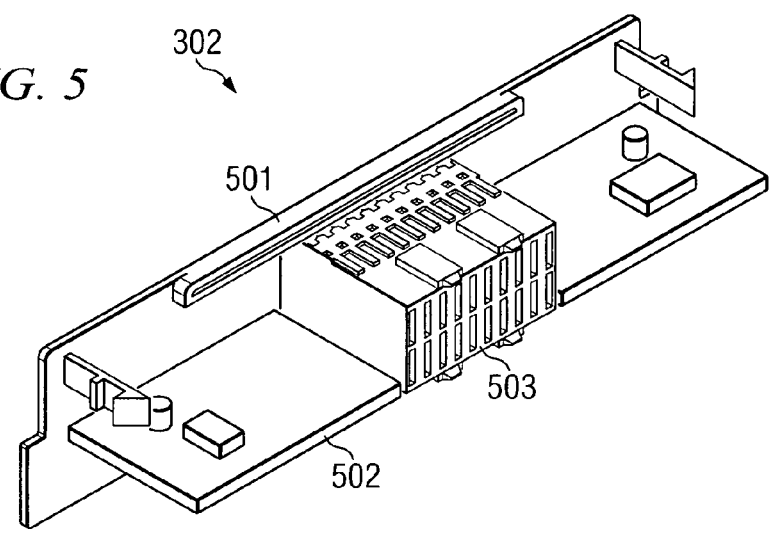
FIG. 5 depicts a cover element according to one representative embodiment.

FIG. 5 depicts a "rear" view of cover element 302 that includes mechanical portion 501, circuit board 502, and oscillator unit 503. Oscillator unit 503 is coupled to circuit board 502. Oscillator unit 503 includes the oscillator crystal and related circuitry. Oscillator unit 503 also includes an interconnect for coupling with header 402. Circuit board 502 may be coupled to mechanical portion 501 using plastic rivets or other suitable fasteners.

Figure 6:
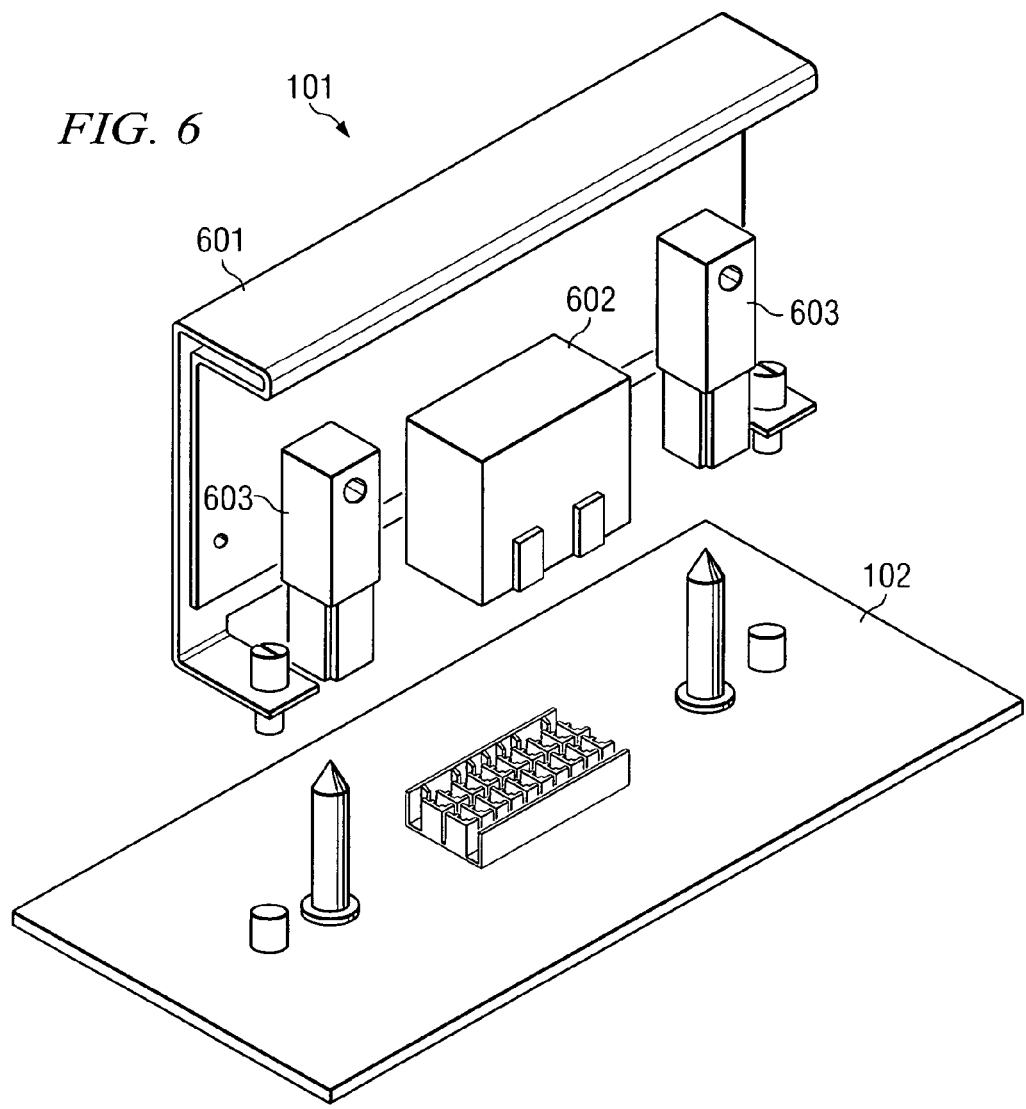
FIG. 6 depicts a redundant clock source implemented according to one representative embodiment.

In another representative embodiment, redundant clock source 101 is implemented to be connected to backplane 102 in a manner that is similar to the connection of hot-swappable oscillators 103. FIG. 6 depicts redundant clock source 101 implemented in this manner. Redundant clock source 101 includes circuit board 601 to which redundant clock source unit 602 is attached. Redundant clock source unit 602 encloses the clock processing circuitry for coupling with an interconnect. Redundant clock source 101 further includes alignment structures 603 to facilitate attachment of redundant clock source 101 during coupling with the interconnect.

Representative embodiments enable redundant clock distribution to electronic equipment to occur. If an oscillator unit fails, the electronic equipment continues to function without interruption. Accordingly, representative embodiments increase the availability of computer servers, telecom equipment, and/or the like. Furthermore, when an oscillator unit fails, the electronic system need not be taken offline to service the failed oscillator unit. Instead, representative embodiments enable a hot-swappable oscillator device to be removed from the system during operation of the system. Moreover, the mechanical implementation causes the replacement of a failing hot-swappable oscillator device to occur in an efficient manner. An LED on the oscillator device signals to the field technician which devices should be replaced. Also, the oscillator unit can be easily retrieved by manual depression of the device housing. The oscillator unit can be replaced by switching out circuit boards from the device cover. Furthermore, by controlling the attenuation applied to the signals from the oscillator units, the replacement of a failed oscillator unit will not typically affect system operations.

What is claimed is:

1. A clock generation system, comprising:
   first and second hot-swappable oscillator (HSO) devices that generate respective timing signals;
   a plurality of controllable attenuators for controllably attenuating one of said timing signals;
   a combiner for combining said timing signals;
   a redundant clock source (RCS) device for generating at least one clock for distribution to other circuits using an output of said combiner; and
   logic for switching which of said timing signals is attenuated in response to failure of one of said first and second HSO devices.

2. The clock generation system of claim 1 further comprising:
   a plurality of bandpass filters for bandpass filtering said timing signals before operation of said combiner.

3. The clock generation system of claim 2 wherein said bandpass filters are surface acoustic wave (SAW) filters.

4. The clock generation system of claim 2 wherein said bandpass filters possess a center frequency that corresponds to a desired operating frequency of said HSO devices.

5. The clock generation system of claim 1 further comprising:
   an external input port for receiving a clock from another circuit, wherein said RCS synchronizes said at least one clock to said received clock.

6. The clock generation system of claim 1 further comprising:
   an external output port for providing said at least one clock to another circuit.

7. The clock generation system of claim 1 wherein each of said first and second HSO devices comprise a cover element that includes an oscillator board.

8. The clock generation system of claim 7 wherein said cover element comprises a plurality of latches, for mechanically coupling said cover element to a base housing, that are releasable by manual depression.

9. The clock generation system of claim 7 wherein said cover element comprises a light emitting element to indicate a functional state of said HSO device.

10. A method of performing clock generation for electronic equipment, comprising:
    generating respective timing signals by hot-swappable oscillator (HSO) devices;
    attenuating one of said timing signals;
    combining said timing signals after said attenuating;
    generating, by a redundant clock source (RCS), a clock for distribution to said electronic equipment using said combined timing signals;
    detecting, by said RCS, failure of one of said HSO devices; and
    switching, by said RCS, which of said timing signals is attenuated in response to said detecting.

11. The method of claim 10 further comprising:
    bandpass filtering said timing signals before performing said combining.

12. The method of claim 11 wherein said bandpass filtering occurs using a center frequency that corresponds to a desired operating frequency of said HSO devices.

13. The method of claim 10 further comprising:
    controlling a light emitting diode (LED) to indicate that said failed HSO device may be removed.

14. The method of claim 13 further comprising:
    replacing a crystal oscillator module of said failed HSO device, wherein, during said replacing, said failed HSO device remains coupled to a backplane and a cover element containing a crystal oscillator module is removed from said failed HSO device.

15. The method of claim 14 wherein said cover element comprises a plurality of latches for mechanically coupling said cover element to a base portion of said failed HSO device.

16. The method of claim 15 wherein said plurality of latches are releasable by manual depression of sides of said failed HSO device.

17. The method of claim 9 further comprising:
    outputting said clock to a port for external communication.

18. A system, comprising:
    first and second means for generating timing signals in a hot-swappable manner;
    means for controllably attenuating one of said timing signals;
    means for combining said timing signals after operation of said means for controllably attenuating;
    means for generating at least one clock for distribution to circuits of said system using an output of said means for combining; and
    means for switching which of said timing signals is attenuated in response to failure of one of said first and second means for generating.

19. The system of claim 18 further comprising:
first and second means for respectively filtering each of said timing signals.

20. The system of claim 18 further comprising:
means for outputting said at least one clock to an external port.

21. The system of claim 18 further comprising:
means for indicating to a user whether one of said first and second means for generating are ready to be removed from said system.

* * * * *

UNITED STATES PATENT AND TRADEMARK OFFICE
CERTIFICATE OF CORRECTION

PATENT NO. : 7,199,671 B2
APPLICATION NO. : 11/095115
DATED : April 3, 2007
INVENTOR(S) : Daniel Wissell et al.

It is certified that error appears in the above-identified patent and that said Letters Patent is hereby corrected as shown below:

In column 4, line 28, after "to" insert -- inform the --.

Signed and Sealed this

Twenty-sixth Day of August, 2008

JON W. DUDAS
*Director of the United States Patent and Trademark Office*